(12) United States Patent
Johnson et al.

(10) Patent No.: US 12,398,293 B2
(45) Date of Patent: Aug. 26, 2025

(54) COMPOSITION AND METHOD FOR POLISHING BORON DOPED POLYSILICON

(71) Applicant: CMC Materials, Inc., Aurora, IL (US)

(72) Inventors: Brittany Johnson, Wood Dale, IL (US); Brian Reiss, Woodridge, IL (US); Alexander W. Hains, Aurora, IL (US); Roman A. Ivanov, Aurora, IL (US)

(73) Assignee: CMC MATERIALS LLC, Wilmington, DE (US)

( * ) Notice: Subject to any disclaimer, the term of this patent is extended or adjusted under 35 U.S.C. 154(b) by 44 days.

(21) Appl. No.: 17/584,532

(22) Filed: Jan. 26, 2022

(65) Prior Publication Data

US 2022/0235247 A1    Jul. 28, 2022

Related U.S. Application Data

(60) Provisional application No. 63/141,650, filed on Jan. 26, 2021.

(51) Int. Cl.
*H01L 21/321* (2006.01)
*C09G 1/02* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| | | |
|---|---|---|
| 5,328,553 A | 7/1994 | Poon |
| 5,382,532 A * | 1/1995 | Kobayashi ...... H01L 21/823842 438/587 |
| 5,395,801 A | 3/1995 | Doan et al. |
| 5,445,996 A | 8/1995 | Kodera et al. |
| 5,449,314 A | 9/1995 | Meikle et al. |
| 5,976,928 A | 11/1999 | Kirlin et al. |
| 8,932,479 B2 * | 1/2015 | Kamimura ........... C09K 3/1463 216/2 |
| 2002/0068452 A1 | 6/2002 | Homma et al. |
| 2012/0028467 A1 | 2/2012 | Kamimura |
| 2019/0085205 A1 | 3/2019 | Chien |
| 2019/0085209 A1 * | 3/2019 | Dockery ........... H01L 21/30625 |
| 2019/0153263 A1 * | 5/2019 | Morinaga ............ C09K 3/1409 |
| 2020/0308449 A1 * | 10/2020 | Mae ......................... C09G 1/02 |
| 2021/0017421 A1 | 1/2021 | Ward et al. |

FOREIGN PATENT DOCUMENTS

| | | | |
|---|---|---|---|
| CN | 111094481 A | 5/2020 | |
| DE | 10247202.5 A | 10/2003 | |
| DE | 10247201.7 A | 12/2003 | |
| EP | 0843359 A2 | 5/1998 | |
| EP | 3153558 A1 * | 4/2017 | ............... C09G 1/02 |
| SG | 10202001434 R | 10/2020 | |
| WO | 2021011196 A1 | 1/2021 | |

OTHER PUBLICATIONS

Korean Intellectual Property Office Acting as ISA, International Search Report and Written Opinion of the ISA issued in connection with Application No. PCT/US2022/013789 on May 12, 2022.

* cited by examiner

*Primary Examiner* — Shamim Ahmed

(57) ABSTRACT

The invention provides a method of chemically mechanically polishing a substrate, especially a substrate comprising boron-doped polysilicon, comprising contacting the substrate with a chemical-mechanical polishing composition comprising an abrasive selected from α-alumina, silica, and a combination thereof, ferric ion, an organic acid, or a combination thereof, and water. The invention also provides a chemical-mechanical polishing composition comprising α-alumina, a nitrogen-containing compound selected from a zwitterionic homopolymer at, a monomeric ammonium salt, and a combination thereof, an organic acid, and water. The invention further provides a chemical-mechanical polishing composition comprising silica, an organic acid, ferric ion, and water.

7 Claims, No Drawings

COMPOSITION AND METHOD FOR POLISHING BORON DOPED POLYSILICON

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions typically are used in conjunction with polishing pads (e.g., a polishing cloth or disk). The abrasive material may be incorporated into the polishing pad instead of, or in addition to, being suspended in the polishing composition.

Boron-doped polysilicon or boron-polysilicon alloys are increasingly being employed as a patterning hard mask during the fabrication of advanced node memory devices, such as dynamic random access memory (DRAM). It can be challenging to achieve a high removal rate of this material by chemical-mechanical planarization (CMP) due to the high levels of boron in the polysilicon material. In addition to requiring a high removal rate of the boron-polysilicon film, some memory device schemes also require very low removal rates for silicon nitride and/or silicon oxide, which could serve as stopping layers in the device film stack. This presents a selectivity requirement during CMP. In addition, titanium nitride also is used in the fabrication of some memory devices. The ability to tune the relative removal rate of titanium nitride would be a desirable feature for polishing compositions and methods useful in the fabrication of the devices.

Thus, there remains a need in the art for polishing compositions and methods for polishing boron-polysilicon layers with high removal rates and selectivity for the boron-polysilicon.

BRIEF SUMMARY OF THE INVENTION

The invention provides a method of chemically mechanically polishing a substrate comprising: (i) providing a substrate, (ii) providing a polishing pad, (iii) providing a chemical-mechanical polishing composition comprising: (a) an abrasive selected from α-alumina, silica, and a combination thereof, (b) ferric ion, an organic acid, or a combination thereof, and (c) water, wherein the polishing composition has a pH of about 2 to about 4, (iv) contacting the substrate with the polishing pad and the chemical-mechanical polishing composition, and (v) moving the polishing pad and the chemical mechanical polishing composition relative to the substrate to abrade at least a portion of a surface of the substrate to thereby polish the substrate.

The invention also provides a chemical-mechanical polishing composition comprising: (a) about 0.01 wt. % to about 1 wt. % α-alumina, (b) a nitrogen-containing compound selected from a zwitterionic homopolymer at a concentration of about 5 ppm to about 25 ppm, a monomeric ammonium salt at a concentration of about 1 mM to about 10 mM, and a combination thereof, (c) an organic acid, and (d) water, wherein the polishing composition has a pH of about 2 to about 4.

The invention further provides a chemical-mechanical polishing composition comprising: (a) about 1 wt. % to about 5 wt. % silica, (b) an organic acid, (c) ferric ion, and (d) water, wherein the polishing composition has a pH of about 2 to about 4.

DETAILED DESCRIPTION OF THE INVENTION

In an embodiment, the invention provides a chemical-mechanical polishing composition comprising: (a) an abrasive selected from α-alumina, silica, and a combination thereof, (b) ferric ion, an organic acid, or a combination thereof, and (c) water, wherein the polishing composition has a pH of about 2 to about 4.

The chemical-mechanical polishing composition comprises an abrasive selected from α-alumina, silica, and a combination thereof. The α-alumina can be any suitable form of α-alumina.

The polishing composition can comprise any suitable amount of α-alumina. Typically, the polishing composition comprises about 0.01 wt. % or more of α-alumina, e.g., about 0.025 wt. % or more, about 0.05 wt. % or more, about 0.075 wt. % or more, about 0.1 wt. % or more, about 0.125 wt. % or more, about 0.15 wt. % or more, about 0.175 wt. % or more, or about 0.2 wt. % or more. Alternatively, or in addition, the polishing composition comprises about 1 wt. % or less of α-alumina, e.g., about 0.95 wt. % or less, about 0.9 wt. % or less, about 0.85 wt. % or less, about 0.8 wt. % or less, about 0.75 wt. % or less, about 0.7 wt. % or less, about 0.65 wt. % or less, about 0.6 wt. % or less, about 0.55 wt. % or less, about 0.5 wt. % or less, about 0.45 wt. % or less, about 0.4 wt. % or less, about 0.35 wt. % or less, or about 0.3 wt. % or less. Thus, the polishing composition can comprise α-alumina in an amount bounded by any two of the aforementioned endpoints. For example, the polishing composition can comprise about 0.01 wt. % to about 1 wt. % of α-alumina, e.g., about 0.01 wt. % to about 0.9 wt. %, about 0.01 wt. % to about 0.8 wt. %, about 0.01 wt. % to about 0.7 wt. %, about 0.01 wt. % to about 0.6 wt. %, about 0.01 wt. % to about 0.5 wt. %, about 0.05 wt. % to about 0.5 wt. %, about 0.05 wt. % to about 0.4 wt. %, about 0.1 wt. % to about 0.4 wt. %, about 0.1 wt. % to about 0.4 wt. %, or about 0.15 wt. % to about 0.3 wt. %.

The α-alumina comprises particles that can have any suitable average particle size (i.e., average particle diameter). For example, the α-alumina particles can have an average particle size of about 90 nm or more, e.g., about 100 nm or more, about 110 nm or more, about 120 nm or more, about 130 nm of more, about 140 nm or more, or about 150 nm or more. Alternatively, or in addition, the α-alumina particles can have an average particle size of about 300 nm or less, e.g., about 290 nm or less, about 280 nm or less, about 270 nm or less, about 260 nm or less, about 250 nm or less, about 240 nm or less, about 230 nm or less, about 220 nm or less, about 210 nm or less, or about 200 nm or less. Thus, the α-alumina particles can have an average particle size bounded by any two of the aforementioned endpoints. For example, the α-alumina particles can have an average particle size of about 90 nm to about 300 nm, e.g., about 100 nm to about 280 nm, about 100 nm to about 260 nm, about 100 nm to about 240 nm, about 120 nm to about 240 nm, about 120 nm to about 220 nm, or about 120 nm to about 200 nm.

The silica can be any suitable form of suitable. For example, the colloidal silica can be a wet process silica, such as a condensation-polymerized silica. Condensation-polymerized silica typically is prepared by condensing $Si(OH)_4$ to form colloidal particles, where colloidal is defined as having an average particle size between about 1 nm and about 1000 nm. The Si(OH)$_4$ is typically obtained from silicates (e.g., sodium and/or potassium silicates) and silicas obtained thereby can be referred to as silicate-derived silica. Such abrasive particles can be prepared in accordance with U.S. Pat. No. 5,230,833 or can be obtained as any of various commercially available products, such as the Akzo-Nobel Bindzil™ 50/80, 30/360, 159/500, 40/220, 40/130, and CJ2-2 products and the Nalco 1050, 1060, 2327, and 2329 products, as well as other similar products available from DuPont, Bayer, Applied Research, Nissan Chemical, Fuso, and Clariant.

The colloidal silica also can be derived by condensation-polymerization of silicate esters, such as tetramethylorthosilicate (TMOS) and/or tetraethylorthosilicate (TEOS). Silicas derived from silicate esters typically are substantially free of alkali metals.

The polishing composition can comprise any suitable amount of silica. Typically, the polishing composition comprises about 1 wt. % or more of silica, e.g., about 1.2 wt. % or more, about 1.4 wt. % or more, about 1.6 wt. % or more, about 1.8 wt. % or more, about 2 wt. % or more, about 2.2 wt. % or more, or about 2.4 wt. % or more. Alternatively, or in addition, the polishing composition comprises about 5 wt. % or less of silica, e.g., about 4.8 wt. % or less, about 4.6 wt. % or less, about 4.4 wt. % or less, about 4.2 wt. % or less, about 4 wt. % or less, about 3.8 wt. % or less, about 3.6 wt. % or less, about 3.4 wt. % or less, about 3.2 wt. % or less, or about 3 wt. % or less. Thus, the polishing composition can comprise silica in an amount bounded by any two of the aforementioned endpoints. For example, the polishing composition can comprise about 1 wt. % to about 5 wt. % silica, e.g., about 1 wt. % to about 4 wt. %, about 1 wt. % to about 3 wt. %, about 2 wt. % to about 5 wt. %, about 2 wt. % to about 4 wt. %, or about 2 wt. % to about 3 wt. %.

The silica comprises particles that can have any suitable average size (i.e., average particle diameter). For example, the silica particles can have an average particle size of about 40 nm or more, e.g., about 50 nm or more, about 60 nm or more, about 70 nm or more, about 80 nm of more, about 90 nm or more, or about 100 nm or more. Alternatively, or in addition, the silica particles can have an average particle size of about 200 nm or less, e.g., about 180 nm or less, about 160 nm or less, about 140 nm or less, or about 120 nm or less. Thus, the silica particles can have an average particle size bounded by any two of the aforementioned endpoints. For example, the silica particles can have an average particle size of about 40 nm to about 200 nm, e.g., about 40 nm to about 180 nm, about 40 nm to about 160 nm, about 40 nm to about 140 nm, about 40 nm to about 120 nm, about 60 nm to about 200 nm, about 60 nm to about 180 nm, about 60 nm to about 160 nm, about 60 nm to about 140 nm, about 80 nm to about 200 nm, about 80 nm to about 180 nm, about 80 nm to about 160 nm, about 80 nm to about 140 nm, or about 100 nm to about 200 nm.

The abrasive (i.e., α-alumina, silica, or a combination thereof) preferably is colloidally stable. The term colloid refers to the suspension of abrasive particles in the liquid carrier. Colloidal stability refers to the maintenance of that suspension through time. In the context of the invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can comprise ferric ion, an organic acid, or a combination thereof. The ferric ion can be provided in the form of any suitable ferric salt. A non-limiting example of a suitable ferric salt is ferric nitrate. The polishing composition can comprise any suitable amount of ferric ion. The polishing composition can comprise about 0.005 wt. % to about 1 wt. % of ferric ion, e.g., about 0.01 wt. % to about 0.9 wt. %, about 0.02 wt. % to about 0.8 wt. %, about 0.03 wt. % to about 0.6 wt. %, about 0.03 wt. % to about 0.4 wt. %, about 0.03 wt. % to about 0.2 wt. %, or about 0.03 wt. % to about 0.1 wt. %), of ferric ion.

In an embodiment, the polishing composition comprises substantially no ferric ion. In the context of the present invention, "substantially no ferric ion" means that the polishing composition comprises about 0.01 wt. % or less of ferric ion, e.g., about 0.005 wt. % or less, about 0.001 wt. % or less, or about 0.0001 wt. % or less, or that no ferric ion can be detected in the polishing composition.

The polishing composition can comprise an organic acid. The organic acid can be any suitable organic acid. Non-limiting examples of suitable organic acids include tartaric acid, lactic acid, formic acid, acetic acid, maleic acid, L-ascorbic acid, picolinic acid, and malonic acid. When the abrasive is α-alumina, in certain embodiments, the organic acid can be selected from tartaric acid, lactic acid, formic acid, acetic acid, and combinations thereof. When the abrasive is silica, in certain embodiments, the organic acid can be selected from tartaric acid, lactic acid, formic acid, acetic acid, maleic acid, L-ascorbic acid, picolinic acid, malonic acid, and combinations thereof.

The polishing composition can comprise the organic acid at any suitable concentration. For example, the polishing composition can comprise about 1 mM or more of the organic acid, e.g., about 2 mM or more, or about 3 mM or more, or about 4 mM or more, or about 5 mM or more. Alternatively, or in addition, the polishing composition can comprise about 100 mM or less of the organic acid, e.g., about 50 mM or less, about 25 mM or less, about 20 mM or less, about 19 mM or less, about 18 mM or less, about 17 mM or less, about 16 mM or less, or about 15 mM or less. Thus, the polishing composition can comprise the organic acid in an amount bounded by any two of the aforementioned endpoints. For example, the polishing composition can comprise about 1 mM to about 20 mM of the organic acid, e.g., about 1 mM to about 15 mM, about 2 mM to about 15 mM, about 3 mM to about 15 mM, about 3 mM to about 12 mM, about 1 mM to about 12 mM, or about 1 mM to about 10 mM.

The polishing composition comprises water. The water can be any suitable water and can be, for example, deionized water or distilled water. In some embodiments, the polishing composition can further comprise one or more organic solvents in combination with the water. For example, the polishing composition can further comprise a hydroxylic solvent such as methanol or ethanol, a ketonic solvent, an amide solvent, a sulfoxide solvent, and the like.

The polishing composition can have any suitable pH. Typically, the polishing composition has a pH of about 2 or more, e.g., about 2.2 or more, about 2.4 or more, about 2.6 or more, about 2.8 or more, about 3 or more, about 3.4 or more, about 3.8 or more, or about 4 or more. Alternatively, or in addition, the polishing composition can have a pH of about 5 or less, e.g., about 4.8 or less, about 4.6 or less, about 4.4 or less, about 4.2 or less, about 4 or less, about 3.8 or less, about 3.6 or less, about 3.4 or less, or about 3.2 or less. Thus, the polishing composition can have a pH bounded by any two of the aforementioned endpoints. For example, the polishing composition can have a pH of about 2 to about 5, e.g., about 2 to about 4.8, about 2 to about 4.6, about 2 to about 4.4, about 2 to about 4.2, about 2 to about 4, about 3 to about 5, or about 3 to about 4.

The pH of the polishing composition can be adjusted using any suitable acid or base. Non-limiting examples of suitable acids include nitric acid, sulfuric acid, phosphoric acid, and organic acids such as formic acid and acetic acid. Non-limiting examples of suitable bases include sodium hydroxide, potassium hydroxide, and ammonium hydroxide.

The polishing composition optionally further comprises a nitrogen-containing compound selected from a zwitterionic homopolymer, a monomeric ammonium salt, and a combination thereof. In an embodiment, the nitrogen-containing compound is a zwitterionic homopolymer. In another embodiment, the zwitterionic homopolymer is ε-polylysine. The ε-polylysine can have any suitable molecular weight. For example, the ε-polylysine can have a molecular weight of about 5,000 Daltons to about 20,000 Daltons. In another embodiment, the nitrogen-containing compound is a monomeric ammonium salt. The monomeric ammonium salt can be any suitable monomeric ammonium salt. Non-limiting examples of suitable monomeric ammonium salts include diallyldimethylammonium chloride, N-dodecyl-N,N-dimethyl-3-ammonio-1-propanesulfonate (DDMAPS, ammonium hydroxide, and the like.

The polishing composition can comprise a zwitterionic homopolymer at any suitable concentration. For example, the polishing composition can comprise about 5 ppm or more of the zwitterionic homopolymer, e.g., about 6 ppm or more, about 7 ppm or more, about 8 ppm or more, about 9 ppm or more, or about 10 ppm or more. Alternatively, or in addition, the polishing composition can comprise about 25 ppm or less of the zwitterionic homopolymer, e.g., about 24 ppm or less, about 23 ppm or less, about 22 ppm or less, about 21 ppm or less, or about 20 ppm or less. Thus, the polishing composition can comprise the zwitterionic homopolymer in an amount bounded by any two of the aforementioned endpoints. For example, the polishing composition can comprise about 5 ppm to about 25 ppm of the zwitterionic homopolymer, e.g., about 5 ppm to about 24 ppm, about 5 ppm to about 23 ppm, about 5 ppm to about 22 ppm, about 5 ppm to about 21 ppm, or about 5 ppm to about 20 ppm.

The polishing composition can comprise a monomeric ammonium salt at any suitable concentration. For example, the polishing composition can comprise about 1 mM or more of the monomeric ammonium salt, e.g., about 2 mM or more, about 3 mM or more, about 4 mM or more, or about 5 mM or more. Alternatively, or in addition, the polishing composition can comprise about 10 mM or less of the monomeric ammonium salt, e.g., about 9 mM or less, about 8 mM or less, about 7 mM or less, about 6 mM or less, or about 5 mM or less. Thus, the polishing composition can comprise the monomeric ammonium salt in an amount bounded by any two of the aforementioned endpoints. For example, the polishing composition can comprise about 1 mM to about 10 mM of the monomeric ammonium salt, e.g., about 1 mM to about 9 mM, about 1 mM to about 8 mM, about 1 mM to about 7 mM, about 1 mM to about 6 mM, or about 1 mM to about 5 mM.

The polishing composition optionally further comprises a nonionic surfactant. The nonionic surfactant can be any suitable nonionic surfactant. In some embodiments, the nonionic surfactant is selected from an alkyl ethoxylate, a polyethylene glycol, and a combination thereof. The alkyl ethoxylate has the formula: $R(OC_2H_4)_nOH$, wherein R is a $C_1$-$C_{30}$ alkyl group and n is an integer of from 1 to about 1000. The polyethylene glycol has the structure: $H$—$(O$—$CH_2CH_2)_n$—$OH$, wherein n is an integer of from 2 to about 5000.

The polishing composition can comprise any suitable amount of the nonionic surfactant. For example, the polishing composition can comprise about 1 ppm or more of the nonionic surfactant, e.g., about 5 ppm or more, about 10 ppm or more, about 20 ppm or more, about 30 ppm or more, about 40 ppm or more, or about 50 ppm or more. Alternatively, or in addition, the polishing composition can comprise about 1000 ppm or less of the nonionic surfactant, e.g., about 900 ppm or less, about 800 ppm or less, about 700 ppm or less, about 600 ppm or less, or about 500 ppm or less. Thus, the polishing composition can comprise the nonionic surfactant in an amount bounded by any two of the aforementioned endpoints. For example, the polishing composition can comprise about 1 ppm to about 1000 ppm of the nonionic surfactant, e.g., about 5 ppm to about 900 ppm, about 5 ppm to about 800 ppm, about 5 ppm to about 700 ppm, about 5 ppm to about 600 ppm, or about 5 ppm to about 500 ppm.

The polishing composition optionally further comprises a biocide. A non-limiting example of a suitable biocide is a methyl isothiazolinone-based biocide such as Kordek MLX™ (DuPont, Wilmington, Del.). The polishing composition can comprise any suitable amount of the biocide. For example, the polishing composition can comprise about 0.001 wt. % to about 0.2 wt. % of the biocide.

The polishing composition optionally further comprises a buffering agent. The buffering agent can be any suitable buffering agent capable of maintaining the polishing composition at a pH as recited herein. Non-limiting examples of suitable buffering agents include formic acid, malonic acid, acetic acid, oxalic acid, citric acid, phosphoric acid, and salts thereof.

The polishing composition optionally further comprises hydrogen peroxide. The presence of hydrogen peroxide can increase the removal rate of titanium nitride when the polishing composition is used to polish substrates comprising at least one layer of titanium nitride. The polishing composition can comprise any suitable amount of hydrogen peroxide. For example, the polishing composition can comprise about 0.1 wt. % to about 5 wt. % (e.g., about 0.1 wt. % to about 1 wt. %) of hydrogen peroxide.

In an embodiment, the invention provides a chemical-mechanical polishing composition comprising: (a) about 0.01 wt. % to about 1 wt. % α-alumina, (b) a nitrogen-containing compound selected from a zwitterionic homopolymer at a concentration of about 5 ppm to about 25 ppm, a monomeric ammonium salt at a concentration of about 1 mM to about 10 mM, and a combination thereof, (c) an organic acid, and (d) water, wherein the polishing composition has a pH of about 2 to about 4.

In another embodiment, the invention provides a chemical-mechanical polishing composition comprising: (a) about 1 wt. % to about 5 wt. % silica, (b) an organic acid, (c) ferric ion, and (d) water, wherein the polishing composition has a pH of about 2 to about 4.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., α-alumina, silica, ferric ion, organic acid, optional nitrogen-containing compound, optional hydrogen peroxide, and optional nonionic surfactant, etc.) as well as any combination of ingredients (e.g., α-alumina, silica, ferric ion, organic acid, optional nitrogen-containing compound, optional hydrogen peroxide, and optional nonionic surfactant, etc.).

For example, the α-alumina or silica can be dispersed in water. The ferric ion, organic acid, optional nitrogen-containing compound, optional hydrogen peroxide, and optional nonionic surfactant can then be added and mixed by any method that is capable of incorporating the components into the polishing composition. The polishing composition also can be prepared by mixing the components at the surface of the substrate during the polishing operation.

The polishing composition can be supplied as a one-package system comprising α-alumina and/or silica, ferric ion, organic acid, optional nitrogen-containing compound, optional hydrogen peroxide, and optional nonionic surfactant. Alternatively, the α-alumina and/or silica can be supplied as a dispersion in water in a first container, and the ferric ion, organic acid, optional nitrogen-containing compound, optional hydrogen peroxide, and optional nonionic surfactant can be supplied in a second container, either in dry form, or as a solution or dispersion in water. The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the α-alumina and/or silica, ferric ion, organic acid, optional nitrogen-containing compound, optional hydrogen peroxide, and optional nonionic surfactant and water, in amounts such that, upon dilution of the concentrate with an appropriate amount of water, each component of the polishing composition will be present in the polishing composition in an amount within the appropriate range recited above for each component. For example, the α-alumina and/or silica, ferric ion, organic acid, optional nitrogen-containing compound, optional hydrogen peroxide, and optional nonionic surfactant can each be present in the concentration in an amount that is about 2 times (e.g., about 3 times, about 4 times, or about 5 times) greater than the concentration recited above for each component so that, when the concentrate is diluted with an equal volume of water (e.g., 2 equal volumes of water, 3 equal volumes of water, or 4 equal volumes of water, respectively), each component will be present in the polishing composition in an amount within the ranges set forth above for each component. The optional hydrogen peroxide can be added to the concentrate in admixture with the water used to dilute the concentrate prior to use. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically mechanically polishing a substrate comprising: (i) providing a substrate, (ii) providing a polishing pad, (iii) providing a chemical-mechanical polishing composition comprising: (a) an abrasive selected from α-alumina, silica, and a combination thereof, (b) ferric ion, an organic acid, or a combination thereof, and (c) water, wherein the polishing composition has a pH of about 2 to about 4, (iv) contacting the substrate with the polishing pad and the chemical-mechanical polishing composition, and (v) moving the polishing pad and the chemical mechanical polishing composition relative to the substrate to abrade at least a portion of a surface of the substrate to thereby polish the substrate.

The substrate can be any suitable substrate. In certain embodiments, the substrate comprises boron-doped polysilicon or boron-polysilicon alloys. In certain embodiments, the substrate comprises boron-doped polysilicon or boron-polysilicon alloys in combination with silicon oxide and/or silicon nitride. In certain embodiments, the substrate further comprises titanium nitride. The boron-doped polysilicon can be any suitable boron-doped polysilicon, many of which are known in the art. The polysilicon can have any suitable phase and can be amorphous, crystalline, or a combination thereof. The level of boron doping can be any suitable level. For example, the level of boron doping can be about 1 wt. % to about 90%, e.g., about 5 wt. % to about 90%, about 10 wt. % to about 90%, about 20 wt. % to about 90%, about 30 wt. % to about 90%, about 40 wt. % to about 90%, about 50 wt. % to about 90%, about 60 wt. % to about 90%, about 70 wt. % to about 90%, or about 80 wt. % to about 90%. In certain embodiments, the substrate comprises one or more layers of boron-doped polysilicon. In certain embodiments, the substrate further comprises one or more layers selected from silicon nitride, silicon oxide, titanium nitride, and combinations thereof.

The polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW 1, SPM3100 (commercially available from, for example, Eminess Technologies), POLITEX™, NEXPLANAR® E6088 (Cabot Microelectronics, Aurora, Ill.), and Fujibo POLYPAS™ 27. A preferred polishing pad is the EPIC™ D100 pad commercially available from Cabot Microelectronics.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The polishing composition of the invention desirably exhibits a high removal rate when polishing a substrate comprising boron-doped polysilicon or boron-polysilicon alloys according to a method of the invention. For example, when polishing silicon wafers comprising boron-doped polysilicon or boron-polysilicon alloy layers in accordance with an embodiment of the invention, the polishing composition desirably exhibits a removal rate of the boron-doped polysilicon or boron-polysilicon alloy of about 500 Å/min or higher, e.g., about 550 Å/min or higher, about 600 Å/min or higher, about 650 Å/min or higher, about 700 Å/min or higher, about 750 Å/min or higher, about 800 Å/min or higher, about 850 Å/min or higher, about 900 Å/min or higher, about 950 Å/min or higher, about 1000 Å/min or higher, about 1100 Å/min or higher, about 1200 Å/min or higher, about 1300 Å/min or higher, about 1400 Å/min or higher, about 1500 Å/min or higher, about 1600 Å/min or higher, about 1700 Å/min or higher, about 1800 Å/min or higher, about 1900 Å/min or higher, about 2000 Å/min or higher, about 2100 Å/min or higher, about 2200 Å/min or higher, about 2300 Å/min or higher, about 2400 Å/min or higher, about 2500 Å/min or higher, about 2600 Å/min or higher, about 2700 Å/min or higher, about 2800 Å/min or higher, about 2900 Å/min or higher, or about 3000 Å/min or higher.

The polishing composition of the invention desirably exhibits a low removal rate when polishing a substrate comprising silicon oxide and/or silicon nitride according to a method of the invention. For example, when polishing silicon wafers comprising silicon nitride or silicon oxide in accordance with an embodiment of the invention, the polishing composition desirably exhibits a silicon nitride or silicon nitride removal rate of about 100 Å/min or lower, e.g., 95 Å/min or lower, about 90 Å/min or lower, about 85 Å/min or lower, about 80 Å/min or lower, about 75 Å/min or lower, about 70 Å/min or lower, about 65 Å/min or lower, about 60 Å/min or lower, about 55 Å/min or lower, about 50 Å/min or lower, about 45 Å/min or lower, about 40 Å/min or lower, about 35 Å/min or lower, about 30 Å/min or lower, about 25 Å/min or lower, about 20 Å/min or lower, about 15 Å/min or lower, about 10 Å/min or lower, about 5 Å/min or lower, or about 1 Å/min or lower. In some embodiments, the polishing composition exhibits a silicon nitride or silicon oxide removal rate that is too low to be detected.

The polishing composition of the invention can exhibit a variable titanium nitride removal rate. For example, the presence of ferric ion and/or hydrogen peroxide in the polishing composition can increase the removal rate of titanium nitride when used to polish a substrate comprising at least one layer of titanium nitride. The titanium nitride removal rate typically increases with increasing concentration of ferric ion and/or hydrogen peroxide.

EMBODIMENTS (1) In embodiment (1) is presented a method of chemically mechanically polishing a substrate comprising:
  (i) providing a substrate,
  (ii) providing a polishing pad,
  (iii) providing a chemical-mechanical polishing composition comprising:
    (a) an abrasive selected from α-alumina, silica, and a combination thereof,
    (b) ferric ion, an organic acid, or a combination thereof, and
    (c) water,
  wherein the polishing composition has a pH of about 2 to about 4,
  (iv) contacting the substrate with the polishing pad and the chemical-mechanical polishing composition, and
  (v) moving the polishing pad and the chemical mechanical polishing composition relative to the substrate to abrade at least a portion of a surface of the substrate to thereby polish the substrate.

(2) In embodiment (2) is presented the method of embodiment (1), wherein the abrasive is α-alumina, and wherein the polishing composition comprises about 0.01 wt. % to about 1 wt. % of α-alumina.

(3) In embodiment (3) is presented the method of embodiment (2), wherein the α-alumina comprises particles having an average particle size of about 90 nm to about 300 nm.

(4) In embodiment (4) is presented the method of embodiment (2) or embodiment (3), wherein the polishing composition comprises an organic acid at a concentration of about 1 mM to about 10 mM.

(5) In embodiment (5) is presented the method of embodiment (4), wherein the organic acid is selected from tartaric acid, lactic acid, formic acid, acetic acid, and combinations thereof.

(6) In embodiment (6) is presented the method of any one of embodiments (2)-(5), wherein the polishing composition further comprises a nitrogen-containing compound selected from a zwitterionic homopolymer, a monomeric ammonium salt, and a combination thereof.

(7) In embodiment (7) is presented the method of embodiment (6), wherein the zwitterionic homopolymer is present at a concentration of about 5 ppm to about 25 ppm and the monomeric ammonium salt is present at a concentration of about 1 mM to about 10 mM.

(8) In embodiment (8) is presented the method of embodiment (6) or embodiment (7), wherein the nitrogen-containing compound is a zwitterionic homopolymer, and wherein the zwitterionic homopolymer is ε-polylysine.

(9) In embodiment (9) is presented the method of embodiment (6) or embodiment (7), wherein the nitrogen-containing compound is a monomeric ammonium salt.

(10) In embodiment (10) is presented the method of embodiment (9), wherein the monomeric ammonium salt is a dimethyldiallylammonium salt or ammonium hydroxide.

(11) In embodiment (11) is presented the method of any one of embodiments (1)-(10), wherein the polishing composition further comprises a nonionic surfactant selected from an alkyl ethoxylate, a polyethylene glycol, and a combination thereof.

(12) In embodiment (12) is presented the method of any one of embodiments (1)-(11), wherein the polishing composition comprises substantially no ferric ion.

(13) In embodiment (13) is presented the method of embodiment (1), wherein the abrasive is silica, and wherein the polishing composition comprises about 1 wt. % to about 5 wt. % of silica.

(14) In embodiment (14) is presented the method of embodiment (13), wherein the silica comprises particles having an average particle size of about 40 nm to about 200 nm.

(15) In embodiment (15) is presented the method of embodiment (13) or embodiment (14), wherein the polishing composition comprises about 0.01 wt. % to about 1 wt. % of ferric ion.

(16) In embodiment (16) is presented the method of any one of embodiments (13)-(15), wherein the polishing composition further comprises an organic acid selected from maleic acid, L-ascorbic acid, picolinic acid, malonic acid, and combinations thereof.

(17) In embodiment (17) is presented the method of embodiment (16), wherein the organic acid is maleic acid, and wherein the polishing composition comprises about 1 mM to about 100 mM of maleic acid.

(18) In embodiment (18) is presented the method of any one of embodiments (1)-(17), wherein the substrate comprises at least one layer of boron-doped polysilicon on a surface of the substrate, and wherein at least a portion of the boron-doped polysilicon on a surface of the substrate is abraded to polish the substrate.

(19) In embodiment (19) is presented the method of embodiment (18), wherein the substrate further comprises at least one layer of silicon oxide on a surface of the substrate, and wherein at least a portion of the silicon oxide on a surface of the substrate is abraded to polish the substrate.

(20) In embodiment (20) is presented the method of embodiment (18) or embodiment (19), wherein the substrate further comprises at least one layer of silicon nitride on a surface of the substrate, and wherein at least a portion of the silicon nitride on a surface of the substrate is abraded to polish the substrate.

(21) In embodiment (21) is presented the method of embodiment (18) or embodiment (19), wherein the substrate further comprises at least one layer of titanium nitride on a surface of the substrate, and wherein at least a portion of the titanium nitride on a surface of the substrate is abraded to polish the substrate.

(22) In embodiment (22) is presented a chemical-mechanical polishing composition comprising:
(a) about 0.01 wt. % to about 1 wt. % α-alumina,
(b) a nitrogen-containing compound selected from a zwitterionic homopolymer, a monomeric ammonium salt, and a combination thereof,
(c) an organic acid, and
(d) water,
wherein the polishing composition has a pH of about 2 to about 4.

(23) In embodiment (23) is presented the polishing composition of embodiment (22), wherein the α-alumina comprises particles having an average particle size of about 90 nm to about 300 nm.

(24) In embodiment (24) is presented the polishing composition of embodiment (22) or embodiment (23), wherein the nitrogen-containing compound is a zwitterionic homopolymer, and wherein the zwitterionic homopolymer is ε-polylysine, wherein the ε-polylysine is present at a concentration of about 5 ppm to about 25 ppm.

(25) In embodiment (25) is presented the polishing composition of embodiment (22) or embodiment (23), wherein the nitrogen-containing compound is a monomeric ammonium salt.

(26) In embodiment (26) is presented the polishing composition of embodiment (25), wherein the monomeric ammonium salt is a dimethyldiallylammonium salt or ammonium hydroxide, wherein the monomeric ammonium salt is present at a concentration of about 1 mM to about 10 mM.

(27) In embodiment (27) is presented the polishing composition of any one of embodiments (22)-(26), wherein the polishing composition further comprises a nonionic surfactant selected from an alkyl ethoxylate, a polyethylene glycol, and a combination thereof.

(28) In embodiment (28) is presented the polishing composition of any one of embodiments (22)-(27), wherein the polishing composition further comprises an organic acid at a concentration of about 1 mM to about 10 mM.

(29) In embodiment (29) is presented the polishing composition of embodiment (28), wherein the organic acid is selected from tartaric acid, lactic acid, formic acid, acetic acid, and combinations thereof.

(30) In embodiment (30) is presented the polishing composition of any one of embodiments (22)-(29), wherein the polishing composition comprises substantially no ferric ion.

(31) In embodiment (31) is presented a chemical-mechanical polishing composition comprising:
(a) about 1 wt. % to about 5 wt. % silica,
(b) an organic acid,
(c) ferric ion, and
(d) water,
wherein the polishing composition has a pH of about 2 to about 4.

(32) In embodiment (32) is presented the polishing composition of embodiment (31), wherein the silica comprises particles having an average particle size of about 40 nm to about 200 nm.

(33) In embodiment (33) is presented the polishing composition of embodiment (31) or embodiment (32), wherein the organic acid is selected from maleic acid, L-ascorbic acid, picolinic acid, malonic acid, and combinations thereof.

(34) In embodiment (34) is presented the polishing composition of embodiment (33), wherein the organic acid is maleic acid, and wherein the polishing composition comprises about 1 mM to about 20 mM of maleic acid.

The following examples further illustrate the invention but, of course, should not be construed as in any way limiting its scope.

Example 1

This example demonstrates the effect of the amount of α-alumina and lactic acid on the removal rate of boron-doped polysilicon ("B—Si"), silicon nitride ("SiN"), and titanium nitride ("TiN").

Separate substrates comprising layers of B—Si, SiN, or TiN were polished with five different polishing compositions, i.e., Polishing Compositions 1A-1E. Polishing Compositions 1A-1E contained α-alumina and lactic acid in amounts as set forth in Table 1, and each polishing composition had a pH of 3.5. The substrates were polished on a Logitech polishing tool using an E6088 polishing pad under the following conditions: platen speed=93 rpm; polishing head speed=87 rpm; slurry flow rate=50 mL/min; and downforce=27.5 kPa.

Following polishing, the removal rates of B—Si, SiN, and TiN were determined. The results are set forth in Table 1.

TABLE 1

Effect of α-Alumina and Lactic acid on B—Si, SiN, and TiN Removal Rates

| Polishing Composition | % α-Alumina | Lactic Acid Concentration (mM) | Mean SiN RR (Å/min) | Mean TiN RR (Å/min) | Mean B—Si RR (Å/min) |
|---|---|---|---|---|---|
| 1A (inventive) | 0.5 | 11 | 44 | 160 | 2162 |
| 1B (inventive) | 0.5 | 1 | 24 | 188 | 2058 |
| 1C (inventive) | 0.3 | 6 | 29 | 136 | 1948 |
| 1D (inventive) | 0.1 | 11 | 22 | 129 | 1902 |
| 1E (inventive) | 0.1 | 1 | 18 | 130 | 1793 |

As is apparent from the results set forth in Table 1, the highest B—Si removal rates were observed when the polishing composition contained 0.5 wt. % α-alumina, and lowest when the polishing composition contained 0.1 wt. % α-alumina. Thus, this example demonstrates that the removal rate of B—Si increase with increasing concentration of α-alumina. Additionally, lactic acid provided about an increase in B—Si removal rate of about 0.4-0.5% rate per mM lactic acid added. Similarly, the TiN removal rate was highest when the amount of α-alumina was increased. All formulations show desirably low SiN removal rates (<50 Å/min).

Example 2

This example demonstrates the effect of nitrogen-containing compounds on the removal rates of boron-doped polysilicon ("B—Si") and silicon oxide ("TEOS") exhibited by polishing compositions comprising α-alumina.

Separate substrates comprising layers of B—Si or TEOS were polished with thirteen (13) different polishing compositions, i.e., Polishing Compositions 2A-2M. Polishing Compositions 2A-2M contained 0.05 wt. % α-alumina in water at pH values as set forth in Table 2. Polishing Compositions 2A and 2B (comparative) did not contain a nitrogen-containing compound. Polishing Compositions 2C-2M further contained diallyldimethylammonium chloride (DADMAC) (Polishing Compositions 2C-2G), DDMAPS (N-Dodecyl-N,N-dimethyl-3-ammonio-1-propanesulfonate) (Polishing Compositions 2J and 2K), ammonium hydroxide (Polishing Compositions 2H and 2I), or ε-polylysine (ε-PLL) (Polishing Compositions 2L and 2M) at concentrations as set forth in Table 2. The substrates were polished on a Reflexion polishing tool using an E6088 polishing pad under the following conditions: platen speed=123 rpm; polishing head speed=117 rpm; slurry flow rate=350 mL/min; and downforce=24.1 kPa.

Following polishing, the B—Si and TEOS removal rates were determined. The removal rates and B—Si:TEOS selectivities are set forth in Table 2. The B—Si:TEOS selectivity is the ratio of B—Si removal rate to TEOS removal rate.

TABLE 2

Effect of Nitrogen-Containing Compounds on B—Si and TEOS Removal Rates

| Polishing Composition | pH | N-Containing Compound | N-Containing Compound Concentration | B—Si RR (Å/min) | Mean TEOS RR (Å/min) | B—Si:TEOS Selectivity |
|---|---|---|---|---|---|---|
| 2A (comparative) | 3.0 | None | N/A | 2148 | 103 | 20.9 |
| 2B (comparative) | 2.9 | None | N/A | 1842 | 133.5 | 13.8 |
| 2C (inventive) | 3.0 | DADMAC | 1 mM | 2049 | 68 | 30.1 |
| 2D (inventive) | 3.0 | DADMAC | 2 mM | 1955 | 54 | 36.2 |
| 2D (inventive) | 2.9 | DADMAC | 3 mM | 1576 | 42.5 | 37.1 |
| 2F (inventive) | 2.9 | DADMAC | 4 mM | 1577 | 43 | 36.7 |
| 2G (inventive) | 2.9 | DADMAC | 6 mM | 1465 | 35.5 | 41.3 |
| 2H (inventive) | 3.0 | NH$_4$OH | 2 mM | 1908 | 53 | 36.0 |
| 2I (inventive) | 3.0 | NH$_4$OH | 4 mM | 1712 | 46 | 37.2 |
| 2J (inventive) | 3.0 | DDMAPS | 2 mM | 2097 | 74 | 28.3 |
| 2K (inventive) | 3.0 | DDMAPS | 4 mM | 1944 | 71 | 27.4 |
| 2L (inventive) | 3.2 | ePLL | 15 ppm | 1527 | 28.5 | 53.5 |
| 2M (inventive) | 3.0 | ePLL | 30 ppm | 472 | 18.5 | 25.5 |

As is apparent from the results set forth in Table 2, the presence of ε-polylysine (i.e., a zwitterionic homopolymer) at a concentration of about 5 ppm to about 25 ppm, or the presence of DADMAC or DDMAPS (i.e., a monomeric ammonium salt) at a concentration of about 1 mM to about 10 mM significantly improved the B—Si:TEOS selectivity of Polishing Compositions 2C-2M by the suppression of TEOS removal rate. At optimal low levels of the nitrogen-containing compounds, the removal rate of B—Si is reduced minimally, but as the amount of nitrogen-containing compounds increases, the removal rate of B—Si is reduced more. For polishing compositions comprising an α-alumina abrasive, the addition of ε-polylysine reduces the removal rate of B—Si slightly from 1800 to 1500 Å/min, but desirably increases B—Si:TEOS selectivity dramatically, from 14 to 54.

Example 3

This example demonstrates the effect of the amount of α-alumina on the removal rate of B—Si and TEOS exhibited by polishing compositions comprising α-alumina and DADMAC.

Separate substrates comprising layers of B—Si or TEOS were polished with three different polishing compositions, i.e., Polishing Compositions 3A-3C. Polishing Compositions 3A-3C contained 0.01 wt. % α-alumina and 3 mM DADMAC (Polishing Composition 3A), 0.05 wt. % α-alumina and 3 mM DADMAC (Polishing Composition 3B), or 0.05 wt. % α-alumina and no DADMAC (Polishing Composition 3C). Each polishing composition had a pH of 2.9.

Following polishing, the B—Si and TEOS removal rates were determined. The removal rates and B—Si:TEOS selectivities are set forth in Table 3.

TABLE 3

Effect of α-Alumina and DADMAC on B—Si and TEOS Removal Rates

| Polishing Composition | α-alumina (wt. %) | DADMAC (mM) | B-Si RR (Å/min) | Mean TEOS RR (Å/min) | B—Si:TEOS Selectivity |
|---|---|---|---|---|---|
| 3A (inventive) | 0.01 | 3 | 855 | 15.5 | 55.2 |
| 3B (inventive) | 0.05 | 3 | 1576 | 42.5 | 37.1 |
| 3C (comparative) | 0.05 | 0 | 1842 | 133.5 | 13.8 |

As is apparent from the results set forth in Table 3, increasing the amount of α-alumina from 0.01 wt. % to 0.05 wt. % (Polishing Compositions 3A and 3B, respectively) increased the B—Si removal rate by approximately 58%, and reduced the B—Si:TEOS selectivity by approximately 58%, due to an increase in the TEOS removal rate. Polishing Composition 3C, which did not contain DADMAC (or any other nitrogen-containing compound, and was therefore comparative), exhibited a B—Si removal rate that was approximately 35% higher than the B—Si removal rate exhibited by Polishing Composition 3B, and a B—Si:TEOS selectivity that was approximately 35% of the B—Si:TEOS selectivity exhibited by Polishing Composition 3B, which contained 3 mM DADMAC. Thus, the presence of DADMAC in the inventive Polishing Compositions 3A and 3B resulted in a decrease in B—Si removal rate but a significant increase in the B—Si:TEOS selectivity as compared with Polishing Composition 3C, due to the lower TEOS removal rate provided by Polishing Compositions 3A and 3B.

Example 4

This example demonstrates the effect of pH on the B—Si removal rate and B—Si:TEOS selectivity exhibited by polishing compositions comprising α-alumina and ε-polylysine.

Separate substrates comprising layers of B—Si or TEOS were polished with two different polishing compositions, i.e., Polishing Compositions 4A and 4B. Polishing Compositions 4A and 4B contained 0.05 wt. % of α-alumina and 15 ppm of ε-polylysine in water. Polishing Compositions 4A and 4B had pH values of 3.2 and 2.6, respectively.

Following polishing, the B—Si and TEOS removal rates were determined. The removal rates and B—Si:TEOS selectivities are set forth in Table 4.

TABLE 4

Effect of pH on B—Si and TEOS Removal Rates

| Polishing Composition | pH | B—Si RR (Å/min) | Mean TEOS RR (Å/min) | B—Si:TEOS Selectivity |
|---|---|---|---|---|
| 4A (inventive) | 3.2 | 1527 | 28.5 | 53.5 |
| 4B (inventive) | 2.6 | 1502 | 13 | 112 |

As is apparent from the results set forth in Table 4, Polishing Composition 4B, which had a pH of 2.6, exhibited an approximately two-fold increase in B—Si:TEOS selectivity as compared to Polishing Composition 4A, which had a pH of 3.2. The B—Si removal rate was essentially unchanged as between Polishing Compositions 4A and 4B, but the TEOS removal rate was reduced more than two-fold at the lower pH of Polishing Composition 4B, resulting in the increased B—Si:TEOS selectivity.

Example 5

This example demonstrates the effect of maleic acid and a combination of maleic acid and ferric ion on the B—Si removal rate exhibited by polishing compositions comprising colloidal silica.

Separate substrates comprising a layer of B—Si were polished with seven polishing compositions, i.e., Polishing Compositions 5A-5J. Polishing Compositions 5A-5J contained colloidal silica and 0.01 wt. % of Kordek™ MLX (a methyl isothiazolinone-based biocide) and further contained components selected from maleic acid, catechol, L-ascorbic acid, picolinic acid, ferric nitrate, and aluminum nitrate, as set forth in Table 5. The substrates were polished on a Logitech polishing tool using an E6088 polishing pad under the following conditions: platen speed=93 rpm; polishing head speed=87 rpm; slurry flow rate=50 mL/min; and downforce=27.6 kPa.

Following polishing, the B—Si removal rates were determined, and the results are set forth in Table 5.

TABLE 5

Effect of Maleic Acid and Ferric Ion on B—Si Removal Rate

| Polishing Composition | Colloidal Silica (wt. %) | Additional Components (wt. %) | pH | Mean B—Si RR (Å/min) |
|---|---|---|---|---|
| 5A (comparative) | 2.0 | N/A | 2.3 | 397 |
| 5B (inventive) | 2.0 | Maleic Acid (0.058) | 2.3 | 484 |
| 5C (inventive) | 2.0 | Maleic Acid (0.1160) | 2.3 | 449 |
| 5D (inventive) | 2.0 | Maleic Acid (0.058) Ferric Nitrate (0.05) | 2.3 | 978 |
| 5E (inventive) | 2.0 | Maleic Acid (0.058) Ferric Nitrate (0.1) | 2.3 | 1536 |
| 5F (comparative) | 2.0 | Catechol (0.055) | 2.3 | 408 |
| 5G (comparative) | 2.0 | L-Ascorbic Acid (0.088) | 2.3 | 391 |
| 5H (comparative) | 2.0 | Picolinic Acid (0.0615) | 2.3 | 242 |
| 5I (comparative) | 2.0 | Maleic Acid (0.058) | 10.0 | 40 |
| 5J (comparative) | 1.5 | O-Phosphoethanolamine (0.016) Aluminum Nitrate (0.15) | 2.3 | 50 |

As is apparent from the results set forth in Table 5, Polishing Composition 5E, which contained colloidal silica, 0.058 wt. % maleic acid (i.e., an organic acid), and 0.01 wt. % ferric nitrate, exhibited the highest B—Si removal rate of 1S36 Å/min Polishing Composition 5D), which contained the same components as Polishing Composition 5E but contained half as much ferric nitrate, exhibited a B—Si removal rate that was approximately 64% of the B—Si removal rate exhibited by Polishing Composition 5E. These results demonstrate the significant impact of the amount of ferric nitrate on the removal rate of B—Si.

Polishing Compositions 5B and 5C, which include maleic acid at 5 mM and 10 mM, respectively, demonstrated B—Si removal rates that were approximately 22% and 13% greater, respectively, than the B—Si removal rate provided by Polishing Composition 5A, which did not include maleic acid. These results demonstrate that maleic acid significantly increases the B—Si removal rate.

Polishing Composition 5I, which includes the same amounts of maleic acid and Kordek MLX™ as Polishing Composition 5B, but which has a pH of 10, exhibited a significant decrease in the B—Si removal rate compared to Polishing Composition 5B, which has a pH of 2.0.

Polishing Composition 5B, which included an alternative trivalent metal salt to ferric nitrate (aluminum nitrate), exhibited a significantly reduced B—Si removal rate as compared to Polishing Compositions 5D and 5E, which contained ferric nitrate. These results further demonstrate the impact of ferric ion of the removal rate of B—Si.

Example 6

This example demonstrates the effect of downforce on the SiN removal rate exhibited by polishing compositions comprising colloidal silica, maleic acid, and ferric nitrate.

Separate substrates comprising layers of B—Si or SiN were polished with two different polishing compositions, Polishing Compositions 6A and 6B. Both Polishing Compositions 6A and 6B contained colloidal silica and maleic acid. Polishing Compositions 6A and 6B further contained 0.05 wt. % or 0.1 wt. % ferric nitrate, respectively. The substrates were polished on a Reflexion polishing tool using an E6088 polishing pad under the following conditions: platen speed=93 rpm; polishing head speed=87 rpm; and slurry flow rate=250 mL/min. The B—Si substrates were polished at a single downforce of 20.7 kPa. The SiN substrates were polished at a downforce of 20.7 kPa, 13.8 kPa, or 6.9 kPa, as reported in Table 6.

Following polishing, the B—Si and SiN removal rates were determined. The results are set forth in Table 6.

TABLE 6

Effect of Downforce on B—Si and SiN Removal Rates

| | | B—Si Substrates | | SiN Substrates | |
|---|---|---|---|---|---|
| Polishing Composition | Ferric Nitrate (wt. %) | Downforce (kPa) | Removal Rate (Å/min) | Downforce (kPa) | Removal Rate (Å/min) |
| 6A (inventive) | 0.05 | 20.7 | 711 | 20.7 | 70 |
| | | | | 13.8 | 42 |
| | | | | 6.9 | 24 |
| 6B (inventive) | 0.1 | 20.7 | 791 | 20.7 | 72 |
| | | | | 13.8 | 42 |
| | | | | 6.9 | 21 |

As is apparent from the results set forth in Table 6, Polishing Composition 6B, which contained 0.1 wt. % of ferric nitrate, exhibited a B—Si removal rate that was approximately 111% of the B—Si removal rate exhibited by Polishing Composition 6A, which contained 0.05 wt. % of ferric nitrate, at a downforce of 20.7 kPa. These results demonstrate the impact of ferric nitrate concentration on the removal rate of B—Si. At each of the three downforces tested, Polishing Composition 6A exhibited a similar SiN removal rate to that exhibited by Polishing Composition 6B at the same downforce. As an example, at a downforce of 20.7 kPa, Polishing Composition 6A provided a SiN removal rate of 70 Å/min, while Polishing Composition 6B provided an SiN removal rate of 70.2 Å/min.

The SiN removal rates exhibited by both Polishing Compositions 6A and 6B showed linear decreases as the downforce was reduced. Desirably, adjusting the downforce allows for tenability by increasing SiN removal rate at higher downforce but increasing B—Si:SiN selectivity at lower downforce.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising,"

"having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically mechanically polishing a substrate comprising:
   (i) providing a substrate,
   (ii) providing a polishing pad,
   (iii) providing a chemical-mechanical polishing composition comprising:
      (a) a silica abrasive,
      (b) ferric ion, and
      (c) water,
      wherein the polishing composition has a pH of about 2 to about 4,
   (iv) contacting the substrate with the polishing pad and the chemical-mechanical polishing composition, and
   (v) moving the polishing pad and the chemical mechanical polishing composition relative to the substrate to abrade at least a portion of a surface of the substrate to thereby polish the substrate, wherein the substrate comprises at least one layer of boron-doped polysilicon on a surface of the substrate, and wherein at least a portion of the boron-doped polysilicon on the surface of the substrate is abraded to polish the substrate.

2. The method of claim 1, wherein the polishing composition comprises about 1 wt. % to about 5 wt. % of the silica abrasive.

3. The method of claim 2, wherein the silica abrasive comprises particles having an average particle size of about 40 nm to about 200 nm.

4. The method of claim 2, wherein the polishing composition comprises about 0.01 wt. % to about 1 wt. % of ferric ion.

5. The method of claim 2, wherein the polishing composition further comprises an organic acid selected from maleic acid, L-ascorbic acid, picolinic acid, malonic acid, and combinations thereof.

6. The method of claim 5, wherein the organic acid is maleic acid, and wherein the polishing composition comprises about 1 mM to about 100 mM of maleic acid.

7. The method of claim 1, wherein the substrate further comprises at least one layer of silicon oxide on a surface of the substrate, and wherein at least a portion of the silicon oxide on a surface of the substrate is abraded to polish the substrate.

* * * * *